(12) United States Patent
Zhang

(10) Patent No.: US 9,169,546 B2
(45) Date of Patent: Oct. 27, 2015

(54) DEVICE HOUSING AND METHOD FOR MAKING SAME

(71) Applicants: SHENZHEN FUTAIHONG PRECISION INDUSTRY CO., LTD., Shenzhen (CN); FIH (Hong Kong) Limited, Kowloon (HK)

(72) Inventor: Chun-Jie Zhang, Shenzhen (CN)

(73) Assignees: SHENZHEN FUTAIHONG PRECISION INDUSTRY CO., LTD., Shenzhen (CN); FIH (Hong Kong) Limited, Kowloon (HK)

(*) Notice: Subject to any disclaimer, the term of this patent is extended or adjusted under 35 U.S.C. 154(b) by 174 days.

(21) Appl. No.: 14/079,808

(22) Filed: Nov. 14, 2013

(65) Prior Publication Data
US 2014/0377483 A1 Dec. 25, 2014

(30) Foreign Application Priority Data
Jun. 21, 2013 (CN) .......... 2013 1 0248644 8

(51) Int. Cl.
C23C 14/00 (2006.01)
C23C 14/02 (2006.01)
C23C 14/06 (2006.01)
C23C 14/35 (2006.01)
C23C 28/00 (2006.01)

(52) U.S. Cl.
CPC ......... *C23C 14/0015* (2013.01); *C23C 14/0021* (2013.01); *C23C 14/0036* (2013.01); *C23C 14/024* (2013.01); *C23C 14/025* (2013.01); *C23C 14/0664* (2013.01); *C23C 14/352* (2013.01); *C23C 28/321* (2013.01); *C23C 28/345* (2013.01); *C23C 28/347* (2013.01); *Y10T 428/13* (2015.01)

(58) Field of Classification Search
CPC ............ C23C 14/0015; C23C 14/0021; C23C 14/0036; C23C 14/024; C23C 14/025; C23C 14/0664; C23C 14/352; C23C 28/321; C23C 28/345; C23C 28/347; Y10T 428/13
See application file for complete search history.

(56) References Cited

U.S. PATENT DOCUMENTS
6,586,114 B1 * 7/2003 Anton .......................... 428/627

FOREIGN PATENT DOCUMENTS
JP 2009285794 * 12/2009 .............. B23B 27/14

* cited by examiner

Primary Examiner — Michael C Miggins
(74) Attorney, Agent, or Firm — Novak Druce Connolly Bove + Quigg LLP

(57) ABSTRACT

A device housing includes a substrate and a color layer formed on the substrate. The color layer consists substantially of titanium zirconium carbonitride. The color layer has an L* value between about 70 to about 80, an a* value between about 10 to about 15, and an b* value between about 22 to about 30 in the CIE LAB color space. The color layer provides a yellow color for the device housing. A method for making the device housing is also described.

11 Claims, 2 Drawing Sheets

DEVICE HOUSING AND METHOD FOR MAKING SAME

BACKGROUND

1. Technical Field

The present disclosure generally relates to device housings and a method for manufacturing the device housings, particularly device housings having a yellow and metallic appearance and a method for making the device housings.

2. Description of Related Art

Vacuum deposition is used to form a thin film or coating on housings of portable electronic devices, to improve abrasion resistance. However, typical vacuum deposition only can deposit black or gold coatings on the housing, limiting the possible variations in appearance compared to other processes, such as anodic treatment.

Therefore, there is room for improvement within the art.

BRIEF DESCRIPTION OF THE DRAWINGS

Many aspects of the disclosure can be better understood with reference to the following figures. The components in the figures are not necessarily drawn to scale, the emphasis instead being placed upon clearly illustrating the principles of the disclosure.

DETAILED DESCRIPTION

Figure 1:
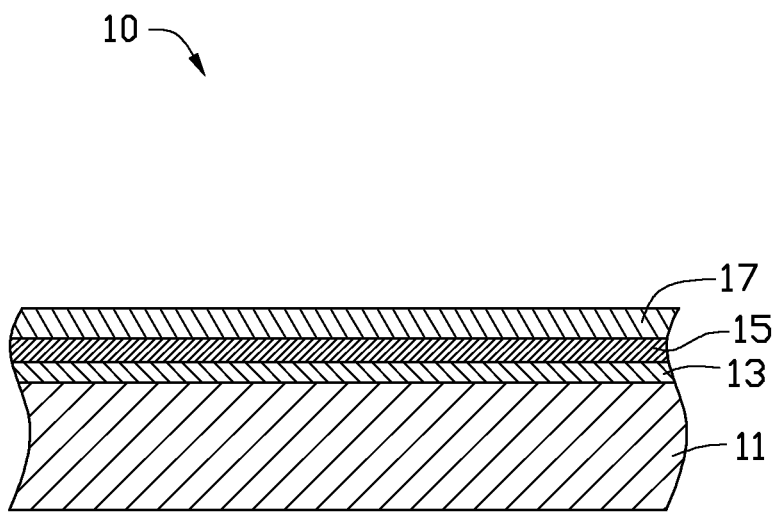
FIG. 1 is a cross-sectional view of an exemplary embodiment of the present device housing.

FIG. 1 shows an exemplary embodiment of a device housing 10. The device housing 10 includes a substrate 11, a base layer 13 directly formed on the substrate 11, an intermediate layer 15 directly formed on the base layer 13, and a color layer 17 directly formed on the intermediate layer 15. The device housing 10 may be a housing of mobile phone, personal digital apparatus, notebook computer, portable music player, GPS navigator, or digital camera. As used in this disclosure, "directly" means a surface of one layer is in contact with a surface of the other layer.

The substrate 11 may be made of metal, such as stainless steel, titanium alloy, or copper alloy. The substrate 11 may also be made of nonmetal materials, such as glass. In the exemplary embodiment, the substrate 11 is made of stainless steel.

The base layer 13 consists substantially of titanium and zirconium. The titanium has a content of about 55% to 70% by weight. In the exemplary embodiment, the titanium has a content of about 60%. The base layer 13 improves the attachment strength of the intermediate layer 15 and the color layer 17. The thickness of the base layer 13 may be about 0.2 μm to about 0.4 μm.

The intermediate layer 15 may consist substantially of aluminum oxide. The intermediate layer 15 has a high hardness, thus improves a total surface hardness of the device housing 10. The thickness of the intermediate layer 15 may be about 0.4 μm to about 0.8 μm. The intermediate layer 15 has a gray color, which does not interfere with the viewed color of the color layer 17.

The color layer 17 may consist substantially of titanium zirconium carbonitride (TiZrCN). The color layer 17 has a yellow color when observed with the naked-eye. The color layer 17 has an L* value between about 70 to about 80, an a* value between about 10 to about 15, and an b* value between about 22 to about 30 in the CIE L*a*b* (CIE LAB) color space. The thickness of the color layer 17 may be about 1.2 μm to about 2.0 μm. The color layer 17 has titanium carbonitride phase and zirconium carbonitride phase, wherein the zirconium carbonitride phase has a high hardness, thereby improving a wear-resistance of the color layer 17. The color layer 17 has a metallic appearance.

The base layer 13 and the color layer 17 can be formed by magnetron sputtering. The intermediate layer 15 can be formed by multi-arc ion plating.

A method for manufacturing the device housing 10 may include the following steps:

The substrate 11 is provided.

Figure 2:
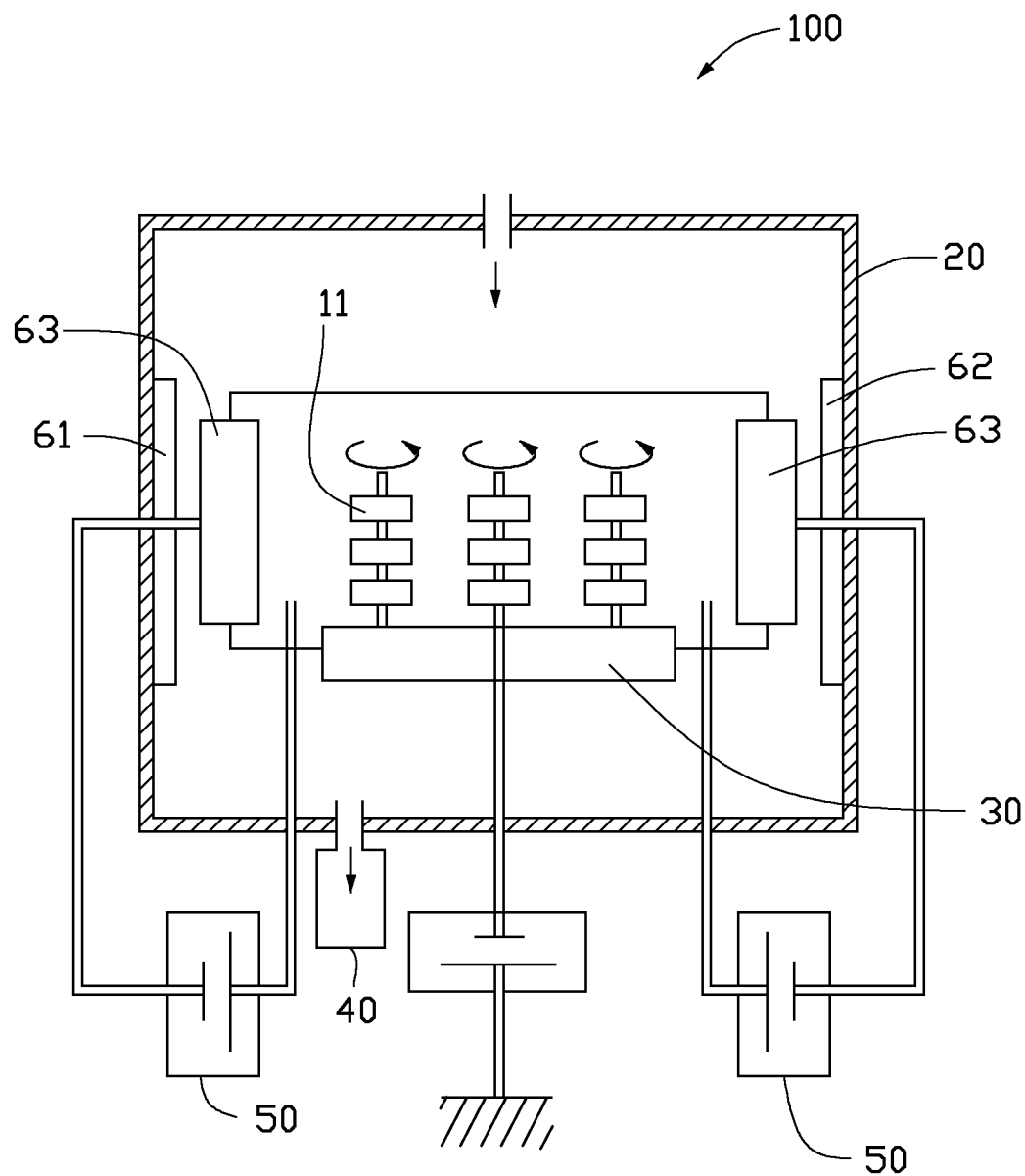
FIG. 2 is a schematic view of a vacuum coating device for manufacturing the device housing of FIG. 1.

The base layer 13 is deposited on the substrate 11 by magnetron sputtering. Magnetron sputtering the base layer 13 is carried out in a vacuum coating device 100 as shown in FIG. 2. The vacuum coating device 100 is a multifunctional coating device which can be used for a multi-arc ion plating process or sputtering plating process. The device 100 includes a chamber 20, a rotating bracket 30 mounted within the chamber 20, a vacuum pump 40 connected to the chamber 20, and arc power sources 50 for generating arc. The vacuum pump 40 is used to evacuate air and gas from the chamber 20. During depositing of the base layer 13, titanium sputtering targets 61 and zirconium sputtering targets 62 are mounted within the chamber 20. The substrate 11 is retained on the rotating bracket 30. The chamber 20 is evacuated to about $3\times10^{-3}$ Pa-$8.0\times10^{-3}$ Pa. Inert gas such as argon at a flow rate of about 100 standard cubic centimeters per minute (sccm) is fed into the chamber 20. An internal temperature in the chamber 20 is set between about 160° C. and about 200° C. A bias voltage of about −250 V is applied to the substrate 11. A duty cycle of a power source of the bias voltage is set at about 50%. The titanium sputtering targets 61 and zirconium sputtering targets 62 are evaporated under an electric power of about 6 kV-8 kV, depositing the base layer 13. Depositing of the base layer 13 takes about 8 min-15 min.

The intermediate layer 15 is deposited on the base layer 13 by multi-arc ion plating. Multi-arc ion plating the intermediate layer 15 is carried out in the vacuum coating device 100. During depositing of the intermediate layer 15, aluminum arc targets 63 are mounted within the chamber 20. The substrate 11 coated with the base layer 13 is retained on the rotating bracket 30. The chamber 20 is evacuated to about $3\times10^{-3}$ Pa-$8.0\times10^{-3}$ Pa. Inert gas such as argon and oxygen are simultaneously fed into the chamber 20. The inert gas has a flow rate of about 100 sccm, and the oxygen has a flow rate between about 150 sccm and about 200 sccm. An internal temperature in the chamber 20 is set between about 160° C. and about 200° C. A bias voltage of about −200 V is applied to the substrate 11. A duty cycle of a power source of the bias voltage is set at about 50%. The aluminum arc targets 63 are evaporated under an electric power having an electric potential of about 15 V-35 V and an electric current of about 40 A-70 A, depositing the intermediate layer 15. Depositing of the intermediate layer 15 takes about 50 min-60 min.

The color layer 17 is deposited on the intermediate layer 15 by magnetron sputtering. Magnetron sputtering the color layer 17 is carried out in the vacuum coating device 100. During depositing of the color layer 17, titanium sputtering targets 61 and zirconium sputtering targets 62 are mounted within the chamber 20. The substrate 11 coated with the base layer 13 and the intermediate layer 15 is retained on the rotating bracket 30. The chamber 20 is evacuated to about $3\times10^{-3}$ Pa-$8.0\times10^{-3}$ Pa. Inert gas such as argon, nitrogen, and acetylene are simultaneously fed into the chamber 20. The inert gas has a flow rate of about 100 sccm, the nitrogen has a flow rate between about 200 sccm and about 230 sccm, and the acetylene has a flow rate between about 200 sccm and about 230 sccm. An internal temperature in the chamber 20 is set between about 160° C. and about 200° C. A bias voltage of about −250 V is applied to the substrate 11. A duty cycle of a power source of the bias voltage is set at about 40%. The titanium sputtering targets 61 and zirconium sputtering targets 62 are evaporated under an electric power of about 5 kV-10 kV, depositing the color layer 17. Depositing of the color layer 17 takes about 35 min-40 min.

The intermediate layer 15 formed by multi-arc ion plating is tightly bonded with the base layer 11. The color layer 17 formed by magnetron sputtering has a smooth surface, thus the color layer 17 has a glossy appearance like a porcelain.

Example

A base layer 13 is deposited on a stainless steel substrate 11 by magnetron sputtering. Titanium sputtering targets 61 and zirconium sputtering targets 62 are mounted within the chamber 20. The substrate 11 is retained on the rotating bracket 30. The chamber 20 is evacuated to about $5 \times 10^{-3}$ Pa. Argon at a flow rate of about 100 sccm is fed into the chamber 20. An internal temperature in the chamber 20 is set at about 180° C. A bias voltage of about −250 V is applied to the substrate 11. A duty cycle of a power source of the bias voltage is set at about 50%. The titanium sputtering targets 61 and zirconium sputtering targets 62 are evaporated under an electric power of about 8 kV, depositing the base layer 13. Depositing of the base layer 13 takes about 8 min. The base layer 13 contains about 60% titanium by weight.

The intermediate layer 15 is deposited on the base layer 13 by multi-arc ion plating. Aluminum arc targets 63 are mounted within the chamber 20. The substrate 11 coated with the base layer 13 is retained on the rotating bracket 30. Argon and oxygen are simultaneously fed into the chamber 20. The argon has a flow rate of about 100 sccm, and the oxygen has a flow rate of about 160 sccm. An internal temperature in the chamber 20 is set at about 180° C. A bias voltage of about −200 V is applied to the substrate 11. A duty cycle of a power source of the bias voltage is set at about 50%. The aluminum arc targets 63 are evaporated under an electric power having an electric potential of about 20V and an electric current of about 60 A-70 A, depositing the intermediate layer 15. Depositing of the intermediate layer 15 takes about 50 min.

The color layer 17 is deposited on the intermediate layer 15 by magnetron sputtering. Titanium sputtering targets 61 and zirconium sputtering targets 62 are mounted within the chamber 20. The substrate 11 coated with the base layer 13 and the intermediate layer 15 is retained on the rotating bracket 30. Argon, nitrogen, and acetylene are simultaneously fed into the chamber 20. The argon has a flow rate of about 100 sccm, the nitrogen has a flow rate of about 220 sccm, and the acetylene has a flow rate of about 220 sccm. An internal temperature in the chamber 20 is set at about 180° C. A bias voltage of about −250 V is applied to the substrate 11. A duty cycle of a power source of the bias voltage is set at about 40%. The titanium sputtering targets 61 and zirconium sputtering targets 62 are evaporated under an electric power of about 6 kV, depositing the color layer 17. Depositing of the color layer 17 takes about 40 min. The color layer 17 has a yellow color.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:
1. A device housing, comprising:
a substrate;
a base layer formed on the substrate;
an intermediate layer formed on the base layer, the intermediate layer consisting substantially of aluminum oxide; and
a color layer formed on the intermediate layer, the color layer consisting substantially of titanium zirconium carbonitride, the color layer having an L* value between about 70 to about 80, an a* value between about 10 to about 15, and an b* value between about 22 to about 30 in the CIE LAB color space.

2. The device housing as claimed in claim 1, wherein the base layer consists substantially of titanium and zirconium.

3. The device housing as claimed in claim 1, wherein the substrate is made of metal.

4. The device housing as claimed in claim 1, wherein the substrate is made of stainless steel.

5. A device housing, comprising:
a substrate; and
a color layer formed on the substrate, the color layer substantially consisting of titanium zirconium carbonitride, the color layer having an L* value between about 70 to about 80, an a* value between about 10 to about 15, and an b* value between about 22 to about 30 in the CIE LAB color space.

6. A method for manufacturing a device housing, comprising:
providing a substrate;
magnetron sputtering a base layer on the substrate, the base layer consisting substantially of titanium and zirconium;
multi-arc ion plating an intermediate layer on the base layer, the intermediate layer consisting substantially of aluminum oxide; and
magnetron sputtering a color layer on the intermediate layer, the color layer consisting substantially of titanium zirconium carbonitride, the color layer having an L* value between about 70 to about 80, an a* value between about 10 to about 15, and an b* value between about 22 to about 30 in the CIE LAB color space.

7. The method of claim 6, wherein magnetron sputtering of the base layer uses titanium and zirconium as targets.

8. The method of claim 6, wherein multi-arc ion plating the intermediate layer uses aluminum as targets, uses oxygen as a reactant gas.

9. The method of claim 8, wherein the oxygen has a flow rate between about 150 sccm and 200 sccm.

10. The method of claim 6, wherein magnetron sputtering of the color layer uses titanium and zirconium as targets, uses nitrogen and acetylene as reactant gases.

11. The method of claim 10, wherein the nitrogen has a flow rate between about 200 sccm and about 230 sccm, and the acetylene has a flow rate between about 200 sccm and about 230 sccm.

* * * * *